(12) United States Patent
Lim

(10) Patent No.: US 6,226,563 B1
(45) Date of Patent: May 1, 2001

(54) METHOD FOR CONTROLLING UNIT PROCESS CONDITIONS OF SEMICONDUCTOR FABRICATING EQUIPMENT ARRANGED IN A PROCESSING LINE

(75) Inventor: Yong-il Lim, Kyonggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 09/148,634

(22) Filed: Sep. 4, 1998

(30) Foreign Application Priority Data

Jan. 14, 1998 (KR) ...................................... 98-803

(51) Int. Cl.[7] ............................ G06F 19/00; G01R 31/26
(52) U.S. Cl. ............................................. 700/121; 438/14
(58) Field of Search ..................... 700/110, 121, 700/230, 109; 438/14

(56) References Cited

U.S. PATENT DOCUMENTS

| | | | | |
|---|---|---|---|---|
| 4,829,445 | * | 5/1989 | Burney | 700/230 |
| 5,696,689 | * | 12/1997 | Okumura | 700/121 |
| 5,751,582 | * | 5/1998 | Saxena | 700/109 |
| 5,862,054 | * | 1/1999 | Li | 700/121 |
| 5,923,553 | * | 7/1999 | Yi | 700/110 |

* cited by examiner

Primary Examiner—William Grant
Assistant Examiner—Ronald D Hartman, Jr.
(74) Attorney, Agent, or Firm—Jones Volentine, LLC

(57) ABSTRACT

A method for controlling equipment in a semiconductor fabrication system including automatically receiving operational state data from equipment in a semiconductor fabrication system and determining whether the operational state data corresponding to any of the equipment is abnormal. If the operational state data is abnormal for certain equipment, it is determined whether the operational state data indicate all units of the certain equipment are in non-operational states. If all units of the certain equipment are in the non-operational states, all process condition data corresponding to the certain equipment is blocked off in the host computer, whereby the equipment is isolated from a fabrication processing flow. Otherwise, non-operational units of the certain equipment are identified, indicated by respective parameters of the operational state data having non-operational state values, and a subset of the process condition data corresponding to the non-operational units is blocked off in the host computer. As a result, lots to be processed in the equipment can be dispersed according to the actual operational capabilities of the equipment and the productivity of the equipment can be controlled efficiently.

6 Claims, 4 Drawing Sheets

METHOD FOR CONTROLLING UNIT PROCESS CONDITIONS OF SEMICONDUCTOR FABRICATING EQUIPMENT ARRANGED IN A PROCESSING LINE

BACKGROUND OF THE INVENTION

1. Field of the Invention

The present invention relates to a method for controlling equipment in a semiconductor manufacturing system, and more particularly, to a method for automatically controlling process conditions that reflect actual operational capabilities of units within the equipment, through an unit monitoring module, to maximize the productivity of the system.

2. Description of the Related Art

Generally, the fabrication of semiconductor devices involves highly precise processes that require finely tuned precision equipment. Several pieces of precision equipment are typically employed in sequence and arranged on a semiconductor processing line. The operation of each piece of precision equipment on the line is closely monitored by operators to maintain and enhance the efficiency of the processing line.

As shown in FIG. 1, conventional fabrication equipment 3 are disposed on a conventional processing line. When a lot (not shown) of workpieces, such as wafers, are introduced into the equipment 3, the equipment 3 performs a fabrication process on the lot. The equipment 3 is connected on-line to a host computer 1 through an equipment server 4. An operator interface (O/I) 2, for example an operator interface personal computer (O/I PC), is also connected on-line to the host computer 1. Through the O/I 2, an operator informs the host computer 1 that a process using the equipment 3 is about to commence. The operator inputs basic manufacture data into the host computer 1, e.g., the identification number (ID) of the lot to be processed in the equipment 3 and the ID of the equipment 3 for performing the process with the lot.

Then, based on the input basic manufacture data, the host computer 1 searches its data base for the process condition data to be applied to the process on the lot. The host computer 1 immediately downloads these process condition data, including preset process settings, to the equipment. Process settings may include, for example, a desired process time duration or a desired process temperature.

Thereafter, the operator checks the process condition data and inputs a process commencing command or a process terminating command. The lot is then automatically and rapidly routed into and out of the equipment 3. In this manner, the process equipment 3 performs on the workpieces of each lot based on the process settings received.

The equipment 3 performs the processes on the lots by operating units or components of the equipment 3, e.g., loading and unloading ports (not shown), and chambers 5. While the equipment 3 performs the process on the lots, the operator closely monitors the operations of the units of the equipment 3 continuously. If it is recognized that a particular unit, e.g., a particular chamber 5, of the equipment 3 is in an non-operational state, because, for example, the particular unit is undergoing preventative maintenance or it is out of order, then the whole equipment is determined to be in the non-operational state. Consequently, the equipment is turned off to prevent production problems associated with introducing lots into non-operational chambers.

In the processing line, a transferring apparatus, e.g., an auto guided vehicle (AGV) 6, is included to automatically transfer lots among the equipment 3 and between bays of the fabrication facility. The AGV 6 is controlled by commands communicated from the host computer 1 to an on-line transfer apparatus server 7 and then transmitted by the transfer apparatus server to the AGV 6 via a communications link. The host computer 1 continuously communicates operational commands to the AGV 6 so that the AGV 6 can rapidly respond to perform the lot transferring function.

However, such a conventional controlling system suffers from several problems. First, even when only some of the units of the equipment 3 are non-operational and other units are operational, the operator considers the whole equipment 3 to be in the non-operational state. As a result, the equipment 3 is not fully utilized and the productivity of the processing line is not efficiently controlled.

Secondly, since it is very difficult for the operator to recognize the actual operating states of units in real time, equipment 3 with non-operational units may be considered to be in the operational state for some period of time. During this time delay, the operator may introduce lots into the equipment with process condition data designed for normal operations. In this case, an excessive number of lots may be introduced into the equipment compared to the number the equipment can actually handle. This over-introduction of lots may result in the accumulation of lots in the equipment. When lots accumulate in the equipment, the efficiency of the entire processing line is reduced.

Thirdly, even when the operator recognizes that some units are non-operational, the AGV is operated without any intervention of the operator, so that the over-introduction and accumulation of lots in the equipment may still occur, thus increasing the chances of over-introduction.

SUMMARY OF THE INVENTION

It is therefore an object of the present invention to efficiently control the overall productivity of the equipment arranged in a processing line by recognizing the operating states of the units of the equipment automatically, in real time, and providing process condition data to the equipment according to the actual operational capability of the equipment.

It is another object of the present invention to prevent lots from being over-introduced and accumulated in the equipment by controlling the number of the lots to be introduced into the equipment according to the actual operational capability of the equipment.

To achieve the above objects and other objects and advantages of the present invention, the method for controlling equipment in a semiconductor fabrication system includes automatically receiving operational state data from equipment in a semiconductor fabrication system and determining whether the operational state data corresponding to any of the equipment is abnormal. If the operational state data is abnormal for certain equipment, it is determined whether the operational state data indicate all units of the certain equipment are in non-operational states. If all units of the certain equipment are in the non-operational states, all process condition data corresponding to the certain equipment is blocked off in the host computer, whereby the equipment is isolated from a fabrication processing flow. If all units are not non-operational, non-operational units of the certain equipment are identified, indicated by respective parameters of the operational state data having non-operational state values, and a subset of the process condition data corresponding to the non-operational unit is blocked off in the host computer, whereby the non-operational units are isolated from the fabrication processing flow.

In another aspect of the invention, the method also includes downloading an equipment state message into the certain equipment; and downloading a transferring equipment control message whereby the number of lots delivered by the transferring equipment to the non-operational units is changed.

Therefore, the present invention controls the productivity of the processing line with appropriate process conditions corresponding to the actual operational capabilities of the equipment and units thereof.

BRIEF DESCRIPTION OF THE DRAWINGS

The present invention is described in detail with reference to the accompanying drawings, in which.

DETAILED DESCRIPTION OF THE PREFERRED EMBODIMENTS

The present invention now will be described more fully with reference to the accompanying drawings. In this specification, it is understood that equipment can refer to a stand-alone apparatus or a group of such apparatuses. It is also understood that the state of equipment can be the value of a single parameter or an array of values corresponding to several parameters. It is also understood that any predetermined values can be provided in any number of conventional ways known to those of ordinary skill in the art, including, for example, a data base in an on-line storage device, a look-up-table, and manual input by an operator.

Figure 1:
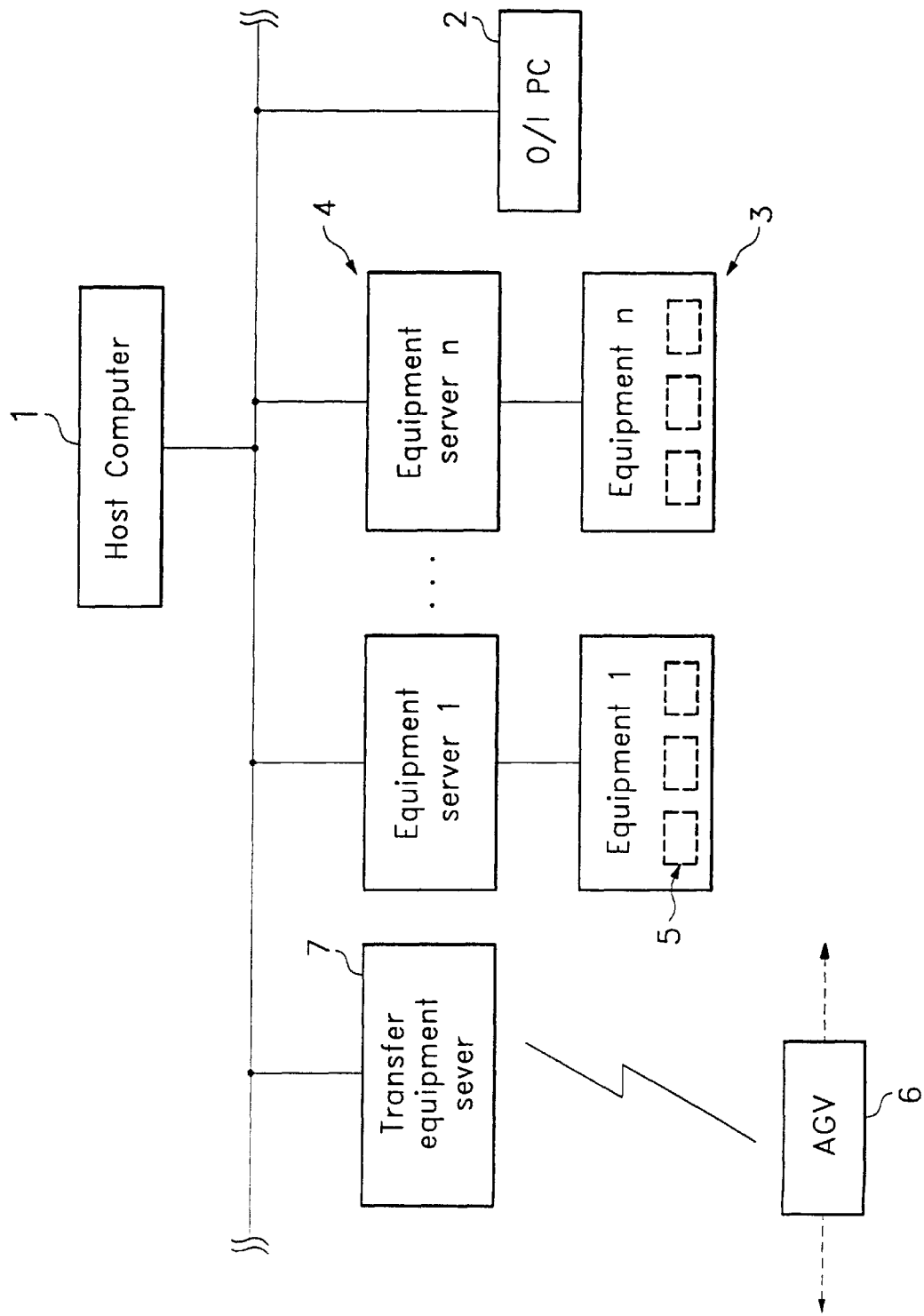
FIG. 1 is a schematic block diagram of a conventional controlling system for semiconductor manufacturing equipment in a processing line.
Figure 2:
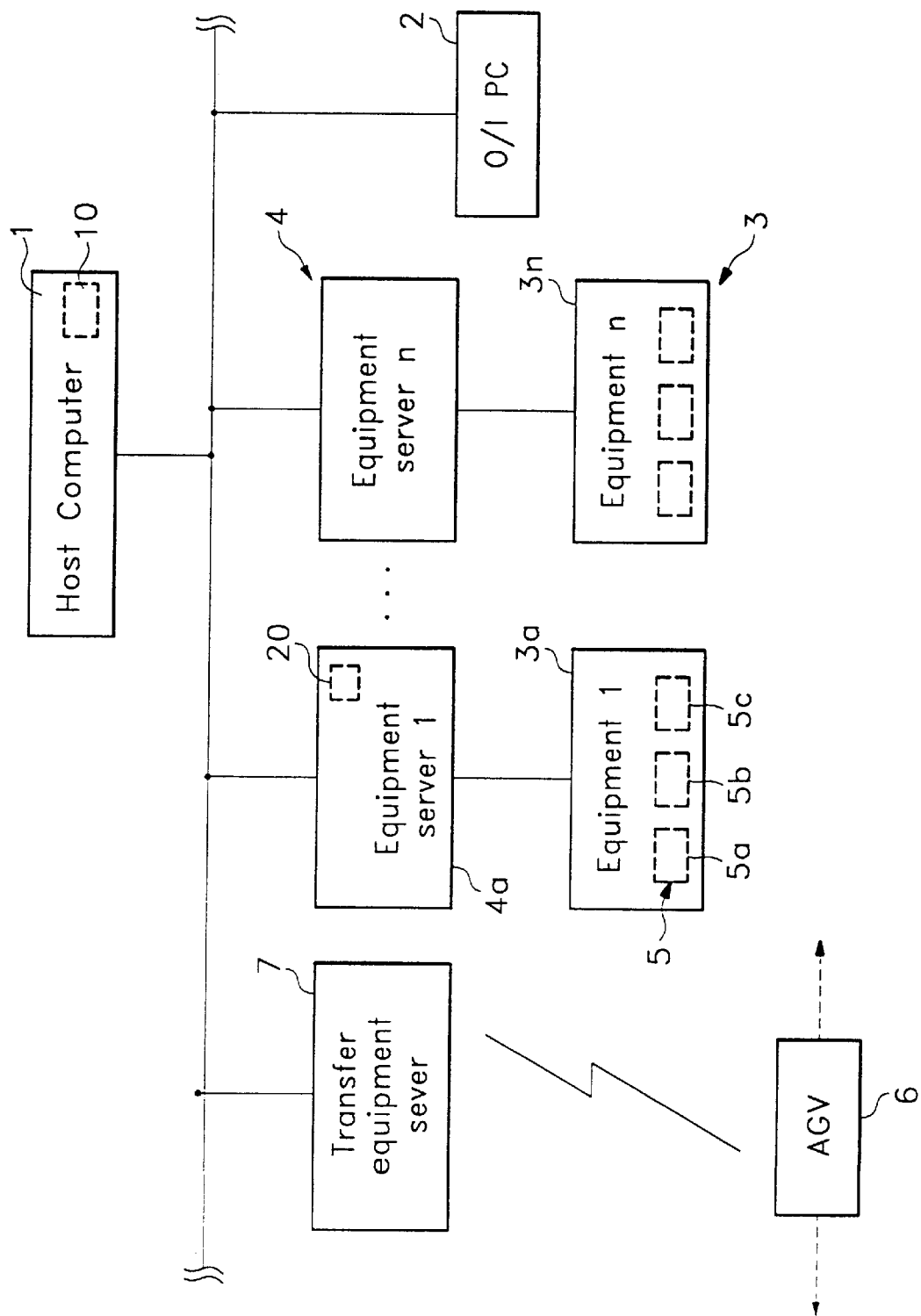
FIG. 2 is a schematic block diagram of a controlling system for semiconductor manufacturing equipment in a processing line using the present invention therein.

As shown in FIG. 2, a host computer 1 includes an unit monitoring module 10 which receives operating state data from equipment 3 including information describing the operating states of units of the equipment 3, which are uploaded from the equipment 3 through respective equipment servers 4. When the unit monitoring module 10 is installed in the host computer 1, a reporting module 20 is installed in each of the equipment servers 4 so that the operating state data of the respective equipment 3 can be reported to the unit monitoring module 10 in real time, automatically.

The unit monitoring module 10 continuously monitors the operating states of the units of the equipment 3 by receiving and checking the operating state data. According to the result of the checking, the unit monitoring module 10 modifies the process conditions that control the process. As a result, the equipment 3 performs the processing according to its actual operational capabilities.

For example, if it is recognized that a first unit of the equipment 3, e.g., a first chamber 5a of the certain equipment 3a, is non-operational, the unit monitoring module 10 blocks off the process condition data on the host computer 1 corresponding to that first unit. When the process condition data are subsequently downloaded into the certain equipment 3a, the first chamber 5a does not receive process condition data while the other chambers, e.g., a second chamber 5b and a third chamber 5c of the first equipment 3a, do receive process condition data. At the same time, the unit monitoring module 10 may control a transfer apparatus, e.g., an AGV 6, to load the lots which were originally to be loaded into the first chamber 5a instead into other equipment, e.g. equipment 3n. As a result, the proper number of lots, according to the operational capability of the certain equipment, are introduced and processed in the certain equipment, e.g., equipment 3a.

Figure 3:
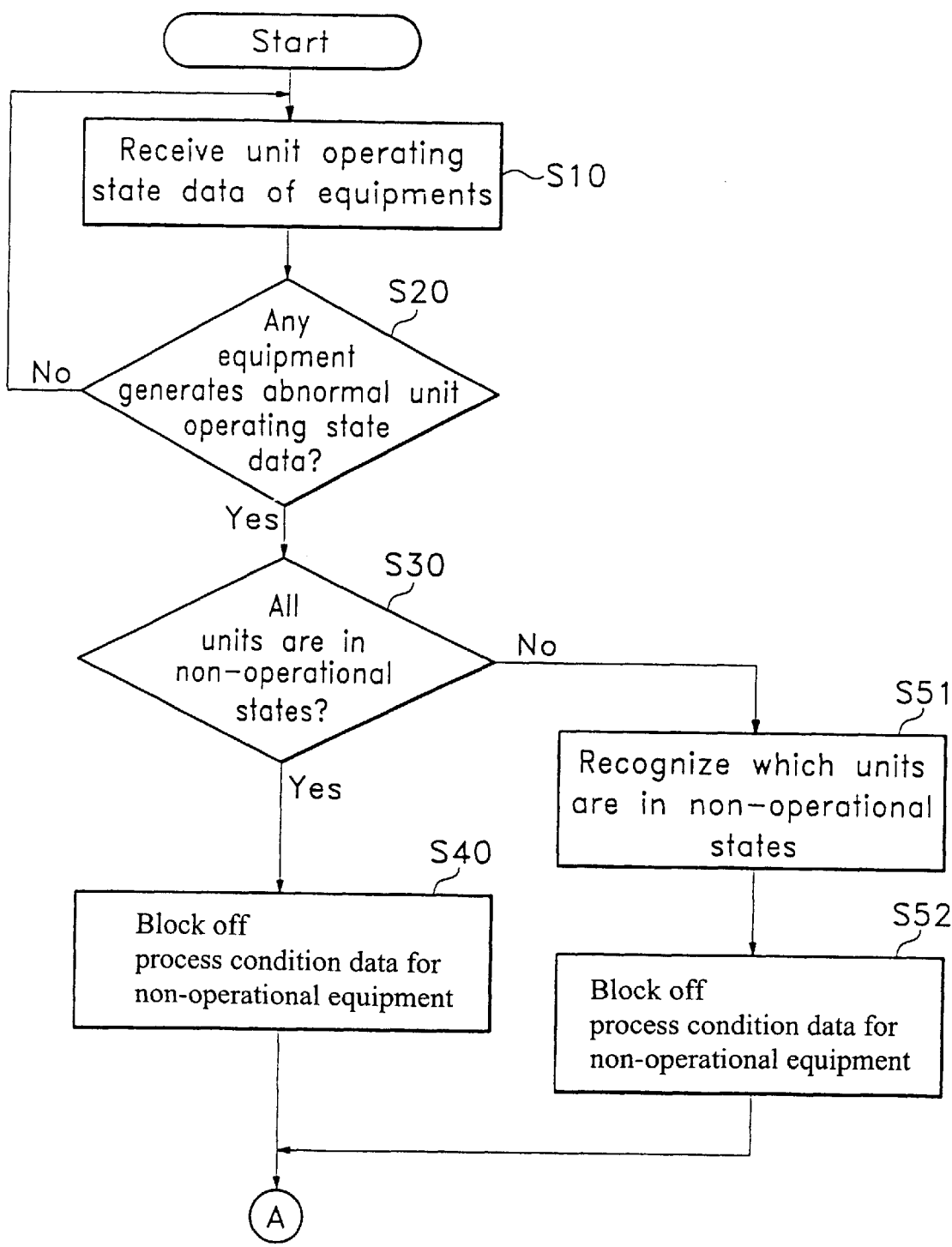
FIG. 3 is a flowchart of a method for automatically controlling process conditions according to the present invention.

Referring to FIG. 3, the method for controlling process conditions of equipment arranged in a processing line is described in more detail. First, the unit monitoring module 10 receives operating state data of the units uploaded from the equipment 3 through the respective equipment server 4 in real time (S10). Accordingly, the operating states of the units of the equipment 3, e.g., the states of the chambers 5, are immediately recognized by the unit monitoring module 10. Then, the unit monitoring module 10 determines whether or not there is any equipment of the equipment 3 which generates abnormal operating state data (S20).

If no equipment generates abnormal operating state data, i.e., all the equipment 3 on the processing line are in the operational states, the unit monitoring module 10 returns the control method flow to the first step S10 of receiving the operating state data.

Otherwise, if it is determined that there is a certain equipment of the equipment 3 which generates abnormal operating state data, the unit monitoring module 10 determines whether or not all of the units of the certain equipment are in the non-operational states (S30).

If it is determined that all of the units of the certain equipment are in the non-operational states, the unit monitoring module 10 sends that result to the host computer 1 so that all of the process condition data for downloading into the certain equipment can be blocked off (S40). As a result, all of the certain equipment is isolated immediately from the normal fabrication processing flow. For example, if all of the first, the second and the third chambers 5a, 5b and 5c of the certain equipment 3a are in non-operational states, the unit monitoring module 10 blocks off all of the process condition data for the certain equipment 3a. Thereby the certain equipment 3a can be isolated immediately from the fabrication process flow, and only the equipment in the operational states engage in the fabrication processing.

Otherwise, if it is determined that all of the units of the certain equipment are not in the non-operational states, i.e., that at least one unit of the certain equipment is operational, the unit monitoring module 10 searches the abnormal operating state data to identify the non-operational unit or units (S51). The module 10 recognizes which units are non-operational because values of the operating state data for parameters corresponding to those units indicate the non-operational states. Then the unit monitoring module 10 sends the results identifying the non-operational units into the host computer 1. The host computer blocks off the process condition data corresponding to the non-operational units but not the process condition data corresponding to the operational units (S52). As a result, the units in the non-operational states are isolated immediately from the normal fabrication processing flow.

For example, if it is recognized that the first chamber 5a of the certain equipment 3a is in the non-operational state and the other chambers, i.e., the second and the third chambers 5b and 5c, are in the operational states, the unit monitoring module 10 sends this result to the host computer 1. The host computer 1 then downloads the process condition data for chambers 'b' and 'c' into the certain equipment 3a for use with the second and third chambers 5b and 5c. The host computer does not download the process condition data for chamber 'a' into the certain equipment 3a for first chamber 5a because these data are blocked. Thus first chamber 5a is not used in the normal fabrication processing flow as performed by the second and the third chambers 5b and 5c. The certain equipment 3a performs the process with the second and third chambers 5b and 5c which are in operational states and not with the first chamber 5a which is in a non-operational state. As a result, the certain equipment 3a performs the fabrication process according to its actual operational capability.

In the conventional controlling system, even though some units of certain equipment are in the operational states, if any of the units are non-operational, the certain equipment as a whole is considered to be non-operational and it is not used. This results in inefficient use of available equipment.

However, in the controlling system according to the present invention, the operational units are distinguished from the non-operational units of the equipment automatically, in real time. Only the non-operational units of certain equipment are isolated from the normal fabrication processing flow so that the other units can perform the normal process as part of that flow. Accordingly, efficient use is made of the available equipment.

Figure 4:
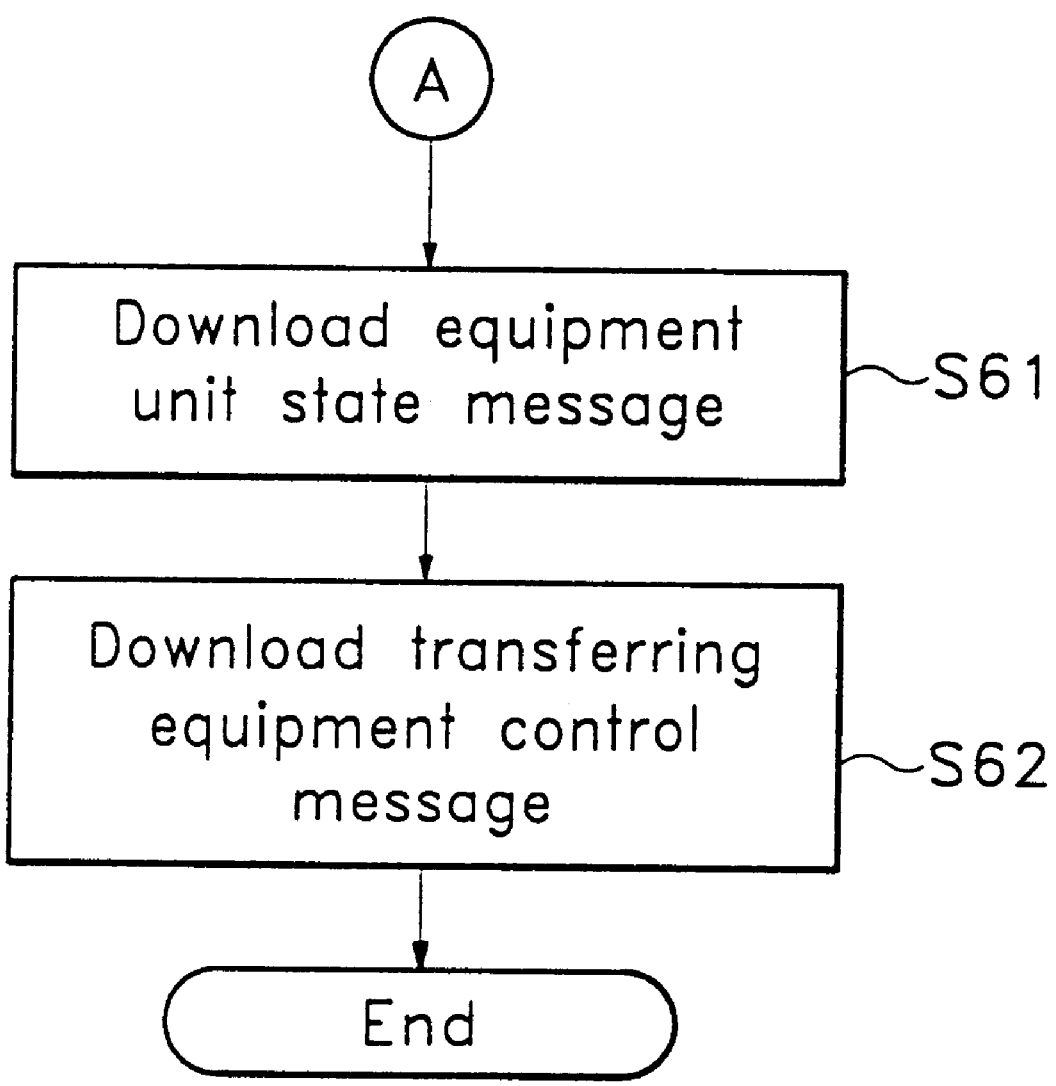
FIG. 4 is a flowchart of a preferred embodiment of a method for automatically controlling process conditions according to the present invention.

Furthermore, as shown in FIG. 4, after the step S40 of blocking off all process condition data for the certain equipment or the steps S51 and S52 of blocking off process condition data for non-operational units of the certain equipment, the unit monitoring module 10 may download an equipment state message into the certain equipment through its equipment server (S61). The equipment state message includes state data for the units of the certain equipment for use in the certain equipment, e.g., for display at a console of the certain equipment. In this way, the operator positioned at the certain equipment can visually recognize the states of the units of the certain equipment.

For example, the unit monitoring module 10 processes the operational state data of the certain equipment 3a as text data, e.g., "The first chamber of the certain equipment is in the down state, the second chamber thereof is in the run state, and the third chamber is in the run state." The certain equipment is the equipment with abnormal operating state data, as determined in step S20. Then the unit monitoring module 10 downloads an equipment state message with this text into the certain equipment 3a through the equipment server 4a. Thereby, the operator can determine immediately the states of the units of the certain equipment, and can make the certain equipment perform a fabrication process according to its actual operational capability. Thereafter, the operator takes appropriate actions, such as a repair job, for the certain equipment, e.g., 3a. In the preferred embodiment, the equipment state message is a stream function message that allows efficient communication.

Then, the unit monitoring module 10 may download a transferring equipment control message capable of controlling transferring equipment, such as an AGV 6 (S62). Accordingly, the transferring equipment 6 disperses the lots according to the actual operational capability of the certain equipment. As a result, problems which may occur when lots accumulate at the certain equipment can be prevented.

For example, the AGV 6 loads only those lots that can be processed in the second and the third chambers 5b and 5c into the certain equipment 3a, and disperses other lots into equipment 3n in which all chambers 5 are in the operational states. Accordingly, the lots are dispersed according to the actual operational capabilities of the equipment 3. As a result, accumulation of the lots at the certain equipment 3a can be prevented.

In a conventional controlling system, because of the delay in the operator's recognizing when some units of a certain equipment are non-operational, the equipment may be considered to be operational when some units are not. In this case, the operator inputs a normal initiation command and the host computer downloads normal process conditions. This may result in the over-introduction of lots compared to the equipment's actual operational capability, and thus to accumulation of lots in the equipment. Moreover, when the AGV 6 is used, the accumulation of the lots in the equipment may be increased.

However, in the present invention, the transferring equipment is controlled immediately, through the unit monitoring module 10, to disperse the lots according to the actual operational capacity of the certain equipment. Therefore, the lots are introduced into the equipment 3 according to the respective actual operational capabilities of that equipment 3. As a result, the problems associated with the accumulation of lots can be prevented in advance.

Furthermore, in the present invention, all adjustments to process condition data are performed automatically, without any intervention of the operator. Therefore the work load of the operator and the number of operators needed may be reduced. As a result of this increased automation, efficiency in using the transferring apparatus and the equipment of the whole processing line is enhanced. In the preferred embodiment, the transferring equipment control message is a stream function message that allows efficient communication.

Thereafter, the unit monitoring module 10 repeatedly performs the above steps. As a result, the overall productivity of the equipment 3 on the processing line can be efficiently and continuously controlled.

As aforementioned, according to the present invention, the operational capabilities of the equipment can be automatically controlled through the unit monitoring module, which results in maximized productivity of the equipment on the processing line.

This invention has been described above with reference to the aforementioned embodiments. It is evident, however, that many alternatives, modifications and variations will be apparent to those having skill in the art in light of the foregoing description. For example, the present invention can be applied to various types of semiconductor manufacturing equipment which are arranged in a processing line and need process conditions supplied without degradation of efficiency. Accordingly, the present invention embraces all such alternatives, modifications and variations as fall within the spirit and scope of the appended claims and their equivalents.

What is claimed is:
1. A method for controlling equipment in a semiconductor fabrication system, the method comprising:
   automatically receiving operational state data from equipment in a semiconductor fabrication system;
   determining whether the operational state data corresponding to any of the equipment is abnormal;
   if the operational state data is abnormal for certain equipment, determining whether any operational state data corresponding to individual units of the certain equipment are abnormal;

if all units of the certain equipment have abnormal operational state data, blocking off a process condition data in a host computer corresponding to the certain equipment, wherein the certain equipment is isolated from a fabrication processing flow;

if a subset of units of the certain equipment have abnormal operational state data, identifying the subset of units of the certain equipment, and blocking off a process condition data in the host computer corresponding to the subset of units after said identifying, wherein the subset of units are isolated from the fabrication processing flow;

wherein, after said blocking off the process condition data corresponding to the certain equipment, said method further comprises:

downloading, into the certain equipment, an equipment state message indicative of the abnormal units of the certain equipment; and downloading a transferring equipment control message into transferring equipment wherein a number of lots delivered to the certain equipment by the transferring equipment is changed.

2. A method for controlling equipment in a semiconductor fabrication system, the method comprising:

automatically receiving operational state data from equipment in a semiconductor fabrication system;

determining whether the operational state data corresponding to any of the equipment is abnormal;

if the operational state data is abnormal for certain equipment, determining whether any operational state data corresponding to individual units of the certain equipment are abnormal;

if all units of the certain equipment have abnormal operational state data, blocking off a process condition data in a host computer corresponding to the certain equipment, wherein the certain equipment is isolated from a fabrication processing flow;

if a subset of units of the certain equipment have abnormal operational state data, identifying the subset of units of the certain equipment, and blocking off a process condition data in the host computer corresponding to the subset of units after said identifying, wherein the subset of units are isolated from the fabrication processing flow;

wherein, after said blocking off process condition data to the subset of units, said method further comprises:

downloading, into the certain equipment, an equipment state message indicative of the abnormal units of the certain equipment; and downloading a transferring equipment control message into transferring equipment wherein a number of lots delivered to the abnormal units of the certain equipment by the transferring equipment is changed.

3. The method of claim 1, wherein:

during said downloading the equipment state message, the equipment state message is a stream function message; and during said downloading the transferring equipment control message, the transferring equipment control message is a stream function message.

4. The method of claim 2, wherein:

during said downloading the equipment state message, the equipment state message is a stream function message; and during said downloading the transferring equipment control message, the transferring equipment control message is a stream function message.

5. The method of claim 1, after said determining whether the operational state data is abnormal for any of the equipment, further comprising returning to said automatically receiving operational state data, if the operational state data is normal for all the equipment.

6. The method of claim 5, after said downloading a transferring equipment control message, further comprising returning to said automatically receiving operational state data.

* * * * *